(12) United States Patent
Kim et al.

(10) Patent No.: US 11,444,229 B2
(45) Date of Patent: Sep. 13, 2022

(54) THERMOELECTRIC MATERIAL, AND THERMOELECTRIC DEVICE AND ELECTRONIC DEVICE COMPRISING THE SAME

(71) Applicant: SAMSUNG ELECTRONICS CO., LTD., Suwon-si (KR)

(72) Inventors: Se Yun Kim, Seoul (KR); Jinhong Kim, Seoul (KR); Hyun Sik Kim, Suwon-si (KR); Chang Soo Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 63 days.

(21) Appl. No.: 16/428,208

(22) Filed: May 31, 2019

(65) Prior Publication Data
US 2019/0371994 A1 Dec. 5, 2019

Related U.S. Application Data

(60) Provisional application No. 62/679,368, filed on Jun. 1, 2018.

(51) Int. Cl.
*H01L 35/16* (2006.01)
*H01L 35/28* (2006.01)

(52) U.S. Cl.
CPC .............. *H01L 35/16* (2013.01); *H01L 35/28* (2013.01)

(58) Field of Classification Search
None
See application file for complete search history.

(56) References Cited

U.S. PATENT DOCUMENTS

| 8,691,612 B2 | 4/2014 | Kim et al. | |
|---|---|---|---|
| 9,671,141 B2 | 6/2017 | Kim et al. | |
| 2012/0225513 A1* | 9/2012 | Kim | H01L 37/00 438/54 |
| 2012/0247524 A1* | 10/2012 | Rolison | H01L 35/22 136/203 |

FOREIGN PATENT DOCUMENTS

| JP | 2013118371 A | 6/2013 |
|---|---|---|
| KR | 20140103765 A | 8/2014 |

(Continued)

OTHER PUBLICATIONS

Dr. Frank Jeffrey, "The Best IoT Power Source May be a Surprise," Electronic Design, Oct. 6, 2016, "http://www.electronicdesign.com/power-sources/best-iot-power-source-may-be-surprise," 11 Pages.

(Continued)

*Primary Examiner* — Shannon M Gardner
(74) *Attorney, Agent, or Firm* — Cantor Colburn LLP

(57) ABSTRACT

A thermoelectric material including a thermoelectric element including thermoelectric inorganic material represented by Chemical Formula 1; and a conduction path in contact with a surface of the thermoelectric element, wherein the conduction path is formed of a conductive material having electrical conductivity of greater than or equal to about 1,000 Siemens per centimeter $$Bi_xSb_{(2-x)}Te_{(3-y-z)}Se_yS_z \qquad \text{Chemical Formula 1}$$

wherein $0<x\leq2$, $0\leq y\leq3$, $0\leq z\leq3$, and $0\leq y+z\leq3$.

16 Claims, 9 Drawing Sheets

(56) References Cited

FOREIGN PATENT DOCUMENTS

| KR | 20160056991 A | 5/2016 |
| KR | 20180020588 A | 2/2018 |

OTHER PUBLICATIONS

Ihtesham Chowdhury et al., "On-chip cooling by superlattice-based thin-film thermoelectrics," Nature nanotechnology, Jan. 25, 2009, pp. 235-238, vol. 4, DOI: 10.1038/NNAN0.2008.417.

Maksym V. Kovalenko et al., "Semiconductor Nanocrystals Functionalized with Antimony Telluride Zintl Ions for Nanostructured Thermoelectrics," JACS Articles, American Chemical Society, Apr. 27, 2010, pp. 6686-6695, vol. 132.

Owen Sullivan et al., "On-Chip Power Generation Using Ultrathin Thermoelectric Generators," Journal of Electronic Packaging, Mar. 2015 (Online Publication Date: Oct. 6, 2014), p. 011005-1-011005-7, vol. 137, DOI: 10.1115/1.4027995.

Sunmi Shin et al., "High-Performance Screen-Printed Thermoelectric Films on Fabrics," Scientific Reports, Aug. 4, 2017, pp. 1-9, vol. 7:7317, DOI: 10.1038/s41598-017-07654-2.

Ziyang Lu et al., "Fabrication of Flexible Thermoelectric Thin Film Devices by Inkjet Printing," Small, Jan. 25, 2014, pp. 3551-3554, vol. 10, No. 17, DOI: 10.1002/smll.201303126.

\* cited by examiner

THERMOELECTRIC MATERIAL, AND THERMOELECTRIC DEVICE AND ELECTRONIC DEVICE COMPRISING THE SAME

CROSS-REFERENCE TO RELATED APPLICATION

This application claims priority to and the benefit of U.S. Provisional Patent Application No. 62/679,368, filed in the United States Patent and Trademark Office on Jun. 1, 2018, the entire content of which is incorporated herein by reference.

BACKGROUND

1. Field

Aspects of the disclosure related to a thermoelectric material, a thermoelectric device, and an electronic device including the same.

2. Description of the Related Art

The thermoelectric effect refers to the phenomenon of a reversible conversion of energy between heat and electricity, wherein a current flow or an electrical potential is generated by the movement of electrons or holes due to a temperature gradient formed within a thermoelectric material. The thermoelectric effect can be classified as a Peltier effect when applied to active heating and cooling by using a temperature difference at opposite ends of the thermoelectric material formed by an externally applied current, and as a Seebeck effect when applied to waste heat power generation by using an electromotive force generated from the temperature difference at opposite ends of the thermoelectric material.

The thermoelectric material for example can be applied as an active cooling system of a semiconductor or electronic device whose cooling needs are not fully resolved by a passive cooling system. The advantages of thermoelectric cooling include a lack of moving parts or circulating condensing liquid, which provides a vibrationless, low-noise, and environmentally-friendly cooling technology without requiring a coolant gas and its associated environmental problems. In addition, if thermoelectric cooling efficiency can be improved by developing a highly-efficient thermoelectric cooling material, the method may be applied in refrigerant-free refrigerators, air conditioners, micro-cooling systems, and the like.

In addition, the thermoelectric material can be used to convert thermal energy to electricity based on the Seebeck effect. Thus, waste thermal energy can be collected and delivered as high-efficiency electrical energy to satisfy the demands of a low carbon environmentally-friendly energy source, and further for use in mobile devices, the development of artificial intelligence, automatic driving, internet of Things technology, and the like.

Accordingly, there remains a need for a thermoelectric material having excellent thermoelectric performance for use in thermoelectric energy generation and thermoelectric cooling.

SUMMARY

Provided is a thermoelectric material showing excellent thermoelectric performance as well as being applicable in various technical fields and a thermoelectric device and an electronic device including the thermoelectric material.

According to an embodiment, a thermoelectric material includes a thermoelectric element including a thermoelectric inorganic material represented by Chemical Formula 1; and a conduction path in contact with a surface of the thermoelectric element, wherein the conduction path includes a conductive material having an electrical conductivity of greater than or equal to about 1000 Siemens per centimeter (S/cm)

   Chemical Formula 1 wherein 0<x≤2, 0≤y≤3, 0≤z≤3, and 0≤y+z≤3.

The thermoelectric element may be a nanoparticle-shaped thermoelectric element, a nanosheet-shaped thermoelectric element, or a combination thereof.

The thermoelectric element may include two or more adjacent thermoelectric elements, and the conduction path may be disposed between the two or more adjacent thermoelectric elements.

The conduction path may be in contact with a surface of each of the two or more adjacent thermoelectric elements.

The conduction path may be extended to separate the two or more adjacent thermoelectric elements by a distance.

The conduction path may be extended to surround each surface of the two or more adjacent thermoelectric elements.

The conductive material may be included in an amount of about 0.01 weight percent (wt %) to about 30 wt % based on a total weight of the thermoelectric material.

The conductive material may have a greater electrical conductivity than the thermoelectric inorganic material.

The conductive material may include at least one of a metal oxide, a metal boride, a metal carbide, a chalcogenide, and a transition metal.

The metal oxide may include at least one of $RuO_2$, $MnO_2$, $ReO_2$, $VO_2$, $OsO_2$, $TaO_2$, $IrO_2$, $NbO_2$, $WO_2$, $GaO_2$, $MoO_2$, $InO_2$, $CrO_2$, and $RhO_2$.

The metal boride may include at least one of $Ta_3B_4$, $Nb_3B_4$, TaB, NbB, $V_3B_4$, and VB.

The metal carbide may include at least one of $Dy_2C$ and $Ho_2C$.

The chalcogenide may include at least one of $AuTe_2$, $PdTe_2$, $PtTe_2$, $YTe_3$, $CuTe_2$, $NiTe_2$, $IrTe_2$, $PrTe_3$, $NdTe_3$, $SmTe_3$, $GdTe_3$, $TbTe_3$, $DyTe_3$, $HoTe_3$, $ErTe_3$, $CeTe_3$, $Bi_2Te_3$, $TiSe_2$, $TiTe_2$, $ZrTe_2$, $HfTe_2$, $TaSe_2$, $TaTe_2$, $NbS_2$, $Hf_3Te_2$, $VSe_2$, $VTe_2$, $NbTe_2$, $LaTe_2$, $LaTe_3$, $CeTe_2$, $TiS_2$, $NbS_2$, and $TaS_2$.

The transition metal may include at least one of Ti, Zr, Hf, V, Nb, Ta, Cr, Mo, W, Mn, Fe, Co, Ni, Cu, Zn, a noble metal, and a rare earth element.

The noble metal may include at least one of Ru, Rh, Pd, Ag, Re, Os, Ir, Pt, and Au.

The rare earth element may include at least one of Sc, Y, La, Ce, Pr, Nd, Pm, Sm, Eu, Gd, Tb, Dy, Ho, Er, Tm, Yb, and Lu.

According to another embodiment, a thermoelectric device includes a first electrode; a second electrode; and the thermoelectric material disposed between the first electrode and the second electrode.

According to another embodiment, an electronic device including the thermoelectric material is provided.

The thermoelectric material according to an embodiment may be fired at a low temperature as well as show excellent thermoelectric performance. In addition, the thermoelectric device including the thermoelectric material may be applied to various electronic devices requiring thermoelectric energy generation and/or thermoelectric cooling.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
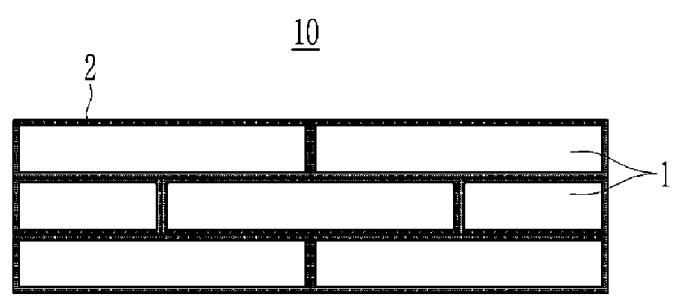
FIG. 1 is a schematic view of a thermoelectric material according to an embodiment.

Exemplary embodiments will hereinafter be described in further detail. However, this disclosure may be embodied in many different forms, and is not to be construed as limited to the exemplary embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "a combination thereof" refers to a combination comprising at least one of the named constituents, components, compounds, or elements, optionally together with one or more like constituents, components, compounds, or elements not named.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, and 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Performance of a thermoelectric material is defined by a dimensionless thermoelectric figure of merit (zT), indicating a criteria for performance of the thermoelectric material has an influence from the Seebeck coefficient (a). Specifically, the thermoelectric figure of merit (zT) is proportional to a square of the Seebeck coefficient (α) and electrical conductivity (σ) as shown in the following equation but inversely proportional to thermal conductivity (κ).

$$zT = \frac{\alpha^2 \sigma}{\kappa} T \qquad \text{Equation}$$

In the Equation, T is an absolute temperature.

In this way, the equation variables are not independent and are mutually influenced, for example the Seebeck coefficient has a relationship with the electrical conductivity and the thermal conductivity, and particularly, the electrical conductivity and the thermal conductivity have a close relationship with each other. Specifically, the thermal conductivity is classified into thermal conductivity because of electrons and thermal conductivity because of lattice vibration (phonon), and the thermal conductivity by electrons is proportional to the electrical conductivity.

As shown in the Equation, in order to increase a zT value of a thermoelectric material, a Seebeck coefficient and an electrical conductivity, or a power factor ($\alpha^2\sigma$), need to be increased and a thermal conductivity needs to be decreased. Accordingly, even though the electrical conductivity (σ) increases, the thermal conductivity (κ) also increases, and accordingly, an increase effect of the thermoelectric figure of merit (zT) may be insignificant or not obtained at all. Accordingly, when a general thermoelectric material is used, there is a limit in improving the thermoelectric figure of merit (zT).

However, the present inventors have discovered how to improve the thermoelectric figure of merit (zT) of a thermoelectric material by adjusting a correlation between electrical conductivity and thermal conductivity. Provided herein is a thermoelectric material capable of suppressing a thermal conductivity increase despite an electrical conductivity increase by combining a material having thermoelectric characteristics and a material having excellent electrical conductivity.

Accordingly, referring to FIGS. 1 to 4, the thermoelectric material is specifically illustrated.

FIG. 1 is a schematic view showing a thermoelectric material according to an embodiment.

A thermoelectric material 10 according to an embodiment includes a thermoelectric element 1 having thermoelectric characteristics and a conduction path 2 in contact with a surface of the thermoelectric element 1. The thermoelectric material 10 includes a thermoelectric inorganic material.

The thermoelectric inorganic material included in the thermoelectric element 1 is not particularly limited, as long as it is an inorganic material having a thermoelectric performance and may be for example a material represented by Chemical Formula 1:

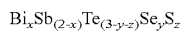

$$Bi_xSb_{(2-x)}Te_{(3-y-z)}Se_yS_z \qquad \text{Chemical Formula 1}$$

wherein 0<x≤2, 0≤y≤3, 0≤z≤3, and 0≤y+z≤3.

In other words, in an embodiment, the thermoelectric inorganic material may be a Bi—Te inorganic material including Bi and Te as a main component. Herein, Sb is optionally doped in a site of Bi, while Se and/or S is optionally doped in a site of Te. A doping degree of Sb, Se, and/or S may be variously adjusted depending on electric characteristics (e.g., n-type semiconductor characteristics or p-type semiconductor characteristics) desired of the thermoelectric inorganic material, and for example, $Bi_2Te_3$, $Bi_{0.5}Sb_{1.5}Te_3$, $Bi_2Te_{2.7}Se_{0.3}$, and the like may be used.

In an embodiment, the thermoelectric element 1 may further include other additives and the like in addition to the thermoelectric inorganic material, or may include only the thermoelectric inorganic material without other additives.

On the other hand, the thermoelectric element 1 has no particular limit to a shape but may include, for example, a thermoelectric nanoparticle-shape having a monocrystalline and/or polycrystalline structure, a circular, oval, or polygonal sheet-shaped thermoelectric nanosheet having a monocrystalline and/or polycrystalline structure, or a combination thereof.

In an embodiment, two or more types of the thermoelectric elements 1 may be included in the thermoelectric material 10 as shown in FIG. 1. Each thermoelectric element 1 can be the same or different within the thermoelectric material 10. Herein, the conduction path 2 may be disposed between at least a portion of the two or more adjacent thermoelectric elements 1. As used herein, "adjacent" means thermoelectric elements that are next to each other.

In an embodiment, the thermoelectric material 10 may include two or more nanosheet-shaped thermoelectric elements 1. Specifically, the thermoelectric material 10 may include two or more nanosheet-shaped thermoelectric elements 1 that are adjacent, as shown in FIG. 1. In an embodiment, the thermoelectric material 10 includes only nanosheet-shaped thermoelectric elements.

Figure 2:
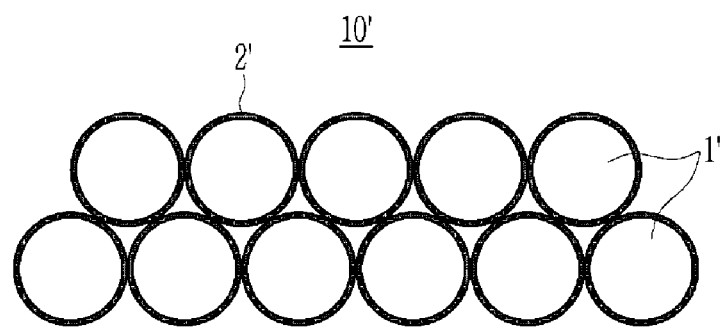
FIG. 2 is a schematic view of a thermoelectric material according to an exemplary embodiment of FIG. 1.

FIG. 2 shows a thermoelectric material according to another exemplary embodiment.

A thermoelectric material 10' may include a nanoparticle-shaped thermoelectric elements 1' that are adjacent, as shown in FIG. 2. In an embodiment, the thermoelectric material 10' includes only nanoparticle-shaped thermoelectric elements. Considering that a conventional thermoelectric material is prepared by firing a thermoelectric inorganic material powder having thermoelectric characteristics, when the thermoelectric material 10' includes only the nanoparticle-shaped thermoelectric elements 1', a conventional firing process may be used.

On the other hand, a shape of the thermoelectric element of the present disclosure is not limited to those of FIGS. 1 and 2, but nanosheet-shaped and nanoparticle-shaped thermoelectric elements may be included together in the thermoelectric material.

The conduction path 2 is in contact with a surface of the thermoelectric element 1 and thus works as a path of electrons moving to or from the thermoelectric element 1. In an embodiment, the conduction path 2 may be formed of a conductive material having electrical conductivity of greater than or equal to about 1,000 S/cm.

The conventional thermoelectric material is formed by firing the thermoelectric element powder, and when a $Bi_2Te_3$ powder is for example used to form a sintered body, the sintered body shows an electrical conductivity of about 600 S/cm to about 900 S/cm.

However, in the thermoelectric material 10 according to an embodiment, the conduction path 2 contacting a surface of the thermoelectric element 1 is formed of a conductive material having electrical conductivity of greater than or equal to about 1,000 S/cm and thus shows higher electrical conductivity than that of the thermoelectric element 1 alone. Accordingly, electrical conductivity of the thermoelectric material 10 may be greatly improved by introducing the conduction path 2 thereinto.

Figure 3:
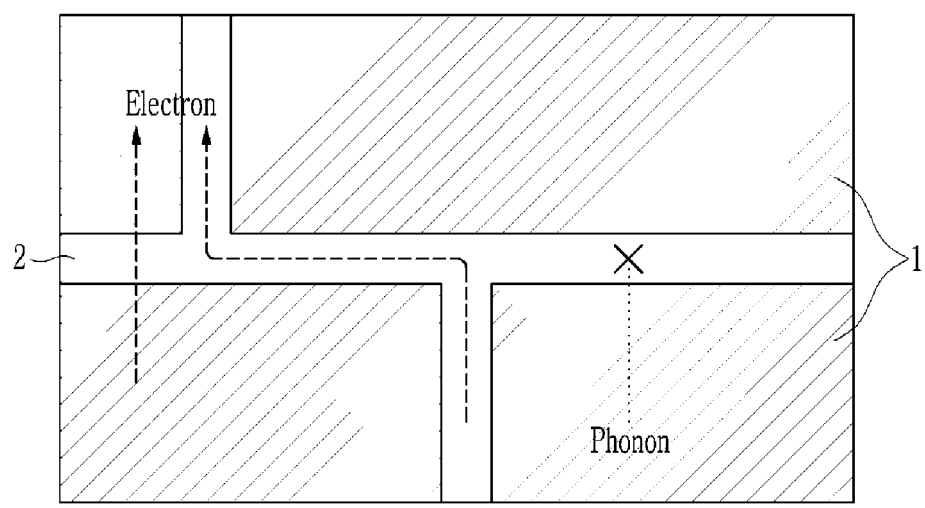
FIG. 3 is a schematic view showing a function of a conduction path in the thermoelectric material of FIG. 1.

FIG. 3 is a view for explaining a function of a conduction path in a thermoelectric material of FIG. 1.

Referring to FIG. 3, a conduction path 2 according to an embodiment may improve the aforementioned electrical conductivity of the thermoelectric material and may also function to block thermal conductivity resulting from the lattice vibration between adjacent thermoelectric elements.

In an embodiment, the conduction path 2 may be a movement path of electrons transported from the thermoelectric element 1, and thus an increase of a thermal conductivity by the electrons occurs.

However, the conduction path 2 blocks lattice vibration from being transferred from the thermoelectric element 1 to other thermoelectric elements 1, and thus may suppress thermal conductivity (i.e., phonons) due to the lattice vibration, as shown in FIG. 3. Specifically, the thermoelectric element 1 has a discontinuous lattice due to the conduction path 2, and since the thermoelectric element 1 and the conduction path 2 are respectively different materials, a crystal defect (e.g., a grain boundary, a potential, and the like) may be generated where the thermoelectric element 1 contacts the conduction path 2. The lattice vibration transferred from the thermoelectric element 1 may be suppressed due to the discontinuous lattice of the thermoelectric element 1 and/or the crystal defect, and as a result, thermal conductivity due to the lattice vibration may be suppressed.

Accordingly, the thermoelectric material 10 according to an embodiment may not only greatly improve electrical conductivity through the conduction path 2, but also thermal conductivity thereof may be rather reduced compared with the conventional thermoelectric material. In other words, the thermoelectric material 10 according to an embodiment may improve a thermoelectric figure of merit (zT) by using the conduction path 2 to adjust the conventional correlation of the electrical conductivity and the thermal conductivity.

The thermoelectric material 10 according to an embodiment may further easily adjust the conventional correlation of the electrical conductivity and the thermal conductivity by disposing the conduction path 2 between the adjacent thermoelectric elements 1.

For example, the conduction path 2 may form a surface contact with (i.e., may be in contact with) at least a portion of each of the two or more adjacent thermoelectric elements 1 (i.e., the conduction path 2 is disposed between two or more adjacent thermoelectric elements and is in contact with at least a portion of a surface of each of the two or more adjacent thermoelectric elements). For example, the conduction path 2 may be extended so that two or more adjacent thermoelectric elements 1 may be respectively spaced apart or separated by a distance (e.g., the adjacent thermoelectric elements may be separated by a distance, where the distance is a width dimension of the conduction path).

Specifically, in an embodiment the conduction path 2 surrounds the surfaces of each thermoelectric nanosheet-shaped thermoelectric element 1 and is combined therewith and thus may block its contact with other adjacent thermoelectric elements 1, as shown in FIG. 1. Herein, the conduction path 2 may fill an empty space among the adjacent thermoelectric nanosheet-shaped thermoelectric elements 1.

In an embodiment, as shown in FIG. 2, a conduction path 2' is extended to form a shell surrounding the surfaces of each thermoelectric nanoparticle-shaped thermoelectric element 1' and combined therewith, and thus blocks contact between adjacent thermoelectric elements 1'. The conduction path 2' particularly occupies a space among the thermoelectric nanoparticle-shaped thermoelectric elements 1'.

This thermoelectric element 1' may be used to prepare a thermoelectric material 10' having excellent thermoelectric performance using a firing method as known in the art.

On the other hand, FIGS. 1 and 2 show that the thermoelectric elements 1 and 1' are compactly surrounded with the conduction paths 2 and 2', respectively, and thus maintain excellent thermoelectric performance as well as show excellent sintering property, and in addition, when the thermoelectric element 1' is manufactured to have a nanoparticle shape or nanosheet shape, the thermoelectric element 1' may be down-sized/thin-filmed to have an average particle diameter and/or a thickness of for example, less than or equal to about 100 micrometers (μm) or for example, less than or equal to about 50 μm.

In an embodiment, the conductive material may be at least one of a metal oxide, a metal boride, a metal carbide, a chalcogenide, and a transition metal, selected so that the conduction path may exhibit excellent suppression effect of electrical conductivity and thermal conductivity.

The conductive material may be one or more of a metal oxide, a metal boride, a metal carbide, a chalcogenide, and a transition metal.

In an embodiment, examples of the metal oxide may be $RuO_2$, $MnO_2$, $ReO_2$, $VO_2$, $OsO_2$, $TaO_2$, $IrO_2$, $NbO_2$, $WO_2$, $GaO_2$, $MoO_2$, $InO_2$, $CrO_2$, $RhO_2$, or a combination thereof.

In an embodiment, examples of the metal boride may be $Ta_3B_4$, $Nb_3B_4$, $TaB$, $NbB$, $V_3B_4$, $VB$, or a combination thereof.

In an embodiment, examples of the metal carbide may be $Dy_2C$, $Ho_2C$, or a combination thereof.

In an embodiment, examples of the chalcogenide may be $AuTe_2$, $PdTe_2$, $PtTe_2$, $YTe_3$, $CuTe_2$, $NiTe_2$, $IrTe_2$, $PrTe_3$, $NdTe_3$, $SmTe_3$, $GdTe_3$, $TbTe_3$, $DyTe_3$, $HoTe_3$, $ErTe_3$, $CeTe_3$, $Bi_2Te_3$, $TiSe_2$, $TiTe_2$, $ZrTe_2$, $HfTe_2$, $TaSe_2$, $TaTe_2$, $NbS_2$, $Hf_3Te_2$, $VSe_2$, $VTe_2$, $NbTe_2$, $LaTe_2$, $LaTe_3$, $CeTe_2$, $TiS_2$, $NbS_2$, $TaS_2$, or a combination thereof.

In an embodiment, examples of the transition metal may be Ti, Zr, Hf, V, Nb, Ta, Cr, Mo, W, Mn, Fe, Co, Ni, Cu, Zn, a noble metal, a rare earth element, or a combination thereof.

In an embodiment, examples of the noble metal may be Ru, Rh, Pd, Ag, Re, Os, Ir, Pt, Au, or a combination thereof.

In an embodiment, examples of the rare earth element may be Sc, Y, La, Ce, Pr, Nd, Pm, Sm, Eu, Gd, Tb, Dy, Ho, Er, Tm, Yb, Lu, or a combination thereof.

In an embodiment, the conductive material may be included in a predetermined amount with respect to the thermoelectric material so that the conduction path may exhibit excellent suppression effect of electrical conductivity and thermal conductivity.

Specifically, the conductive material may be for example included in an amount of greater than or equal to about 0.01 wt %, for example greater than or equal to about 0.05 wt %, greater than or equal to about 0.1 wt %, greater than or equal to about 0.5 wt %, or greater than or equal to about 1 wt %, and for example less than or equal to about 30 wt %, less than or equal to about 25 wt %, less than or equal to about 20 wt %, less than or equal to about 15 wt %, less than or equal to about 10 wt %, or less than or equal to about 5 wt %, or for example about 0.01 wt % to about 30 wt %, about 0.1 wt % to about 30 wt %, about 0.1 wt % to about 20 wt %, about 0.1 wt % to about 10 wt %, about 1 wt % to about 10 wt %, or about 1 wt % to about 5 wt %, based on a total weight of the thermoelectric material.

Figure 4:
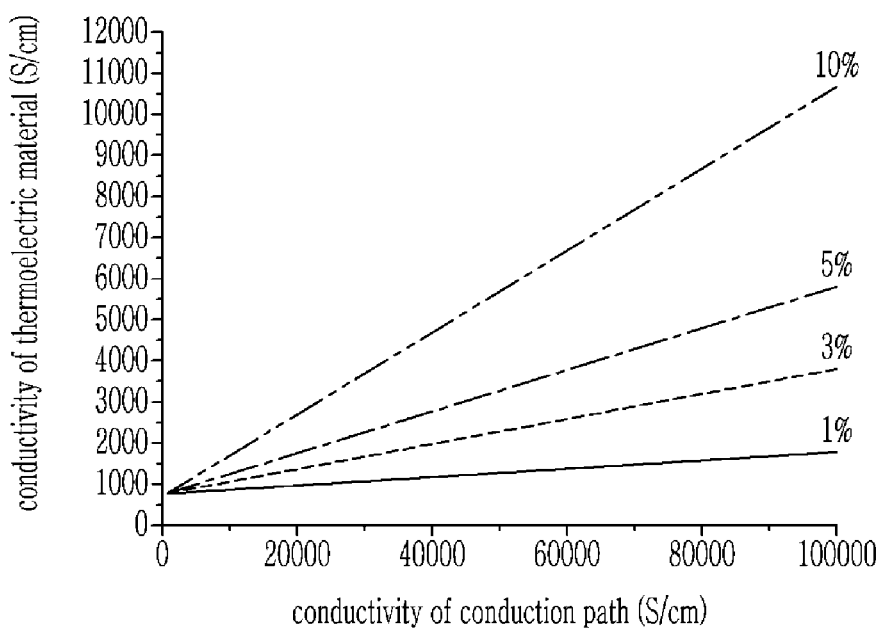
FIG. 4 is a graph of conductivity of the thermoelectric material (Siemens per centimeter, S/cm) versus conductivity of the conduction path (S/cm) showing changes of electrical conductivity of the electrical conductivity-conduction path of the thermoelectric material as the weight of the conductive material increases in the thermoelectric material.

FIG. 4 is a graph showing changes of electrical conductivity of the electrical conductivity-conduction path of the thermoelectric material as the weight of the conductive material increases in the thermoelectric material. FIG. 4 shows an example of using $Bi_2Te_3$ as the thermoelectric inorganic material, and herein, electrical conductivity of $Bi_2Te_3$ is assumed to be about 800 S/cm.

Referring to FIG. 4, when $RuO_2$ having electrical conductivity of about 20,000 S/cm (i.e., when an x-axis is about 20,000 S/cm) is for example used as the conductive material, even though about 1 wt % of $RuO_2$ is included in the thermoelectric material 10, the thermoelectric material 10 has electrical conductivity of about 992 S/cm. The electrical conductivity is increased by about 24% as compared with a case of including no conductive material (i.e., when an x-axis is 0).

In addition, referring to FIG. 4, as the conductive material has higher electrical conductivity and is included in a larger amount, electrical conductivity of the thermoelectric material 10 is further improved.

Accordingly, based on the relationship of FIG. 4, the thermoelectric material according to an embodiment may improve a thermoelectric figure of merit (zT) by using the conduction path to adjust the conventional correlation of electrical conductivity and thermal conductivity.

On the other hand, the thermoelectric material may be prepared through the following manufacturing method.

First, in an embodiment, a method of obtaining the exemplary nanosheet-shaped thermoelectric element 1 may include a process of making a surfactant absorbed in a 001 plane of the crystals by using a raw thermoelectric inorganic material and the surfactant and then, selectively growing the crystals to have a nanosheet shape.

Or, in an embodiment, a process of introducing an exfoliating agent into the raw thermoelectric inorganic material having a layered structure and an exfoliating process thereof may be included.

The aforementioned nanosheet-shaped thermoelectric element 1 may be obtained by these methods. However, the present disclosure is not limited to these two methods but may adopt various methods depending on a type of the raw thermoelectric inorganic material.

On the other hand, in an embodiment, a method of forming a conduction path on the surface of the obtained nanosheet-shaped thermoelectric element 1 may be changed depending on the conductive material, but when the conductive material is for example a metal oxide, a method of making metal cations absorbed in the surface of the thermoelectric element 1 or making a separately-formed metal oxide nano layer adsorbed on the surface of the thermoelectric element 1 may be used.

On the other hand, in an embodiment, the nanoparticle-shaped thermoelectric element 1' may use the thermoelectric inorganic material powder itself or include a process of obtaining monocrystalline/polycrystalline nanoparticles through the selective crystal growth.

In an embodiment, a method of forming a conduction path on the surface of the nanoparticle-shaped thermoelectric element 1' may be the same as the method of forming a conduction path on the surface of the aforementioned nanosheet-shaped thermoelectric element 1 and thus will not be described in detail.

A thermoelectric element obtained through the aforementioned method has a nano shape and thus may be formed into a thin film having a relatively thin thickness (e.g., about 1 nm to about 100 μm), and accordingly, since sintering property thereof due to the nano shape is enhanced, the thermoelectric element may be fired at a lower firing temperature and pressure than those (about 450° C. and about 90 MPa) of the conventional bulk-type thermoelectric material, for example, less than or equal to about 300° C. and less than or equal to about 90 MPa. Accordingly, these thermoelectric materials 10 and 10' may be used as a thermoelectric material for a thermoelectric device of an imbedded flexible printed circuit (FPC).

Hereinafter, referring to FIGS. 5 and 6, a thermoelectric device including the thermoelectric material 10 or 10' according to an embodiment is illustrated. For convenience, FIGS. 5 and 6 show only thermoelectric material 10, but it is to be understood that thermoelectric material 10' could be used in its place.

Figure 5:
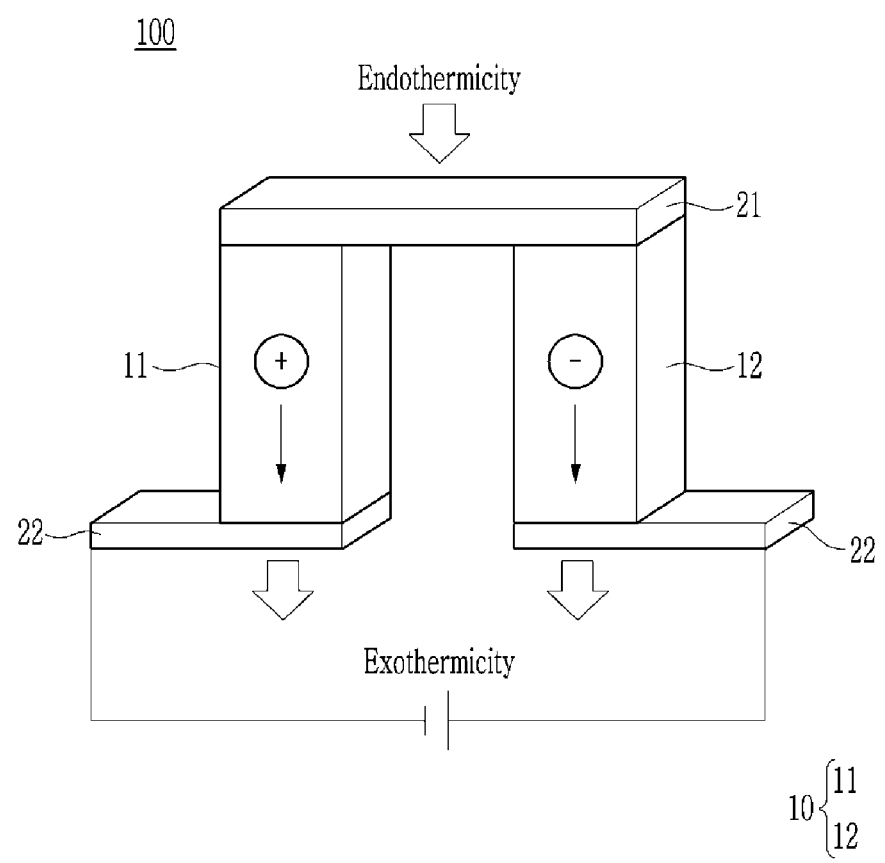
FIG. 5 is a schematic view of a thermoelectric device using a Peltier effect according to an embodiment.
Figure 6:
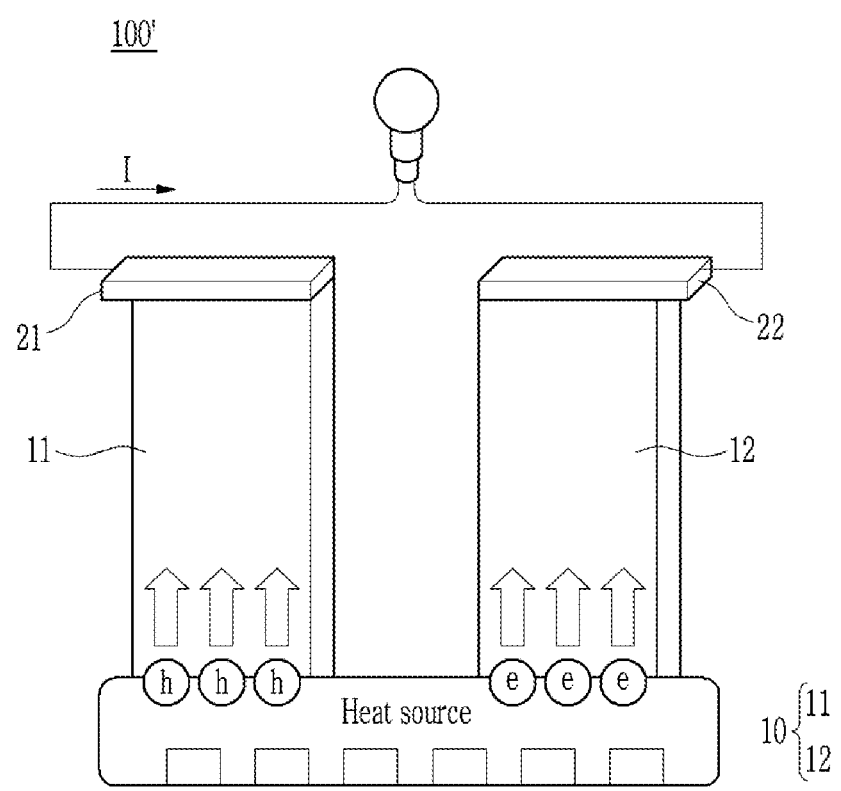
FIG. 6 is a schematic view of a thermoelectric device using a Seebeck effect according to an embodiment.

FIGS. 5 and 6 show examples of the thermoelectric device including the thermoelectric material according to an embodiment, and herein, FIG. 5 shows a thermoelectric device using the Peltier effect, while FIG. 6 shows a thermoelectric device using the Seebeck effect.

Referring to FIG. 5, the thermoelectric device 100 according to an embodiment includes the aforementioned thermoelectric material 10. The thermoelectric material 10 is disposed between a first electrode 21 and a second electrode 22.

The thermoelectric material 10 includes a p-type thermoelectric material 11 and an n-type thermoelectric material 12. In other words, a first thermoelectric material is a p-type thermoelectric material 11, and a second thermoelectric material is an n-type thermoelectric material 12. The first electrode 21 is connected to the p-type thermoelectric material 11 and the n-type thermoelectric material 12 as one body, and the second electrode 22 is spaced apart and respectively connected to the p-type thermoelectric material and the n-type thermoelectric material 12. Holes in the p-type thermoelectric material 11 and electrons in the n-type thermoelectric material 12 respectively move toward the second electrode 22 due to exothermicity of a power source connected to the second electrode 22, and accordingly, heat adsorption proceeds in the first electrode 21.

On the other hand, referring to FIG. 6, a thermoelectric device 100' according to an embodiment includes a heat source and the thermoelectric material 10 absorbing energy from the heat source. The thermoelectric material 10 may be disposed between the first electrode 21 and the second electrode 22, and the first electrode 21 may be disposed between the thermoelectric material 10 and the heat source.

As for the thermoelectric device 100' according to an embodiment, when the thermoelectric material 10 receives heat from the heat source, holes in the p-type thermoelectric material 11 and electrons in the n-type thermoelectric material 12 respectively move toward the second electrode 22, and electromotive power generated due to that may be stored as electric energy.

The thermoelectric devices 100 and 100' according to an embodiment use the aforementioned thermoelectric material 10 as the p-type thermoelectric material 11 and the n-type thermoelectric material 12 and thus may maintain excellent thermoelectric performance and be formed into a thin film as well as show improved thermoelectric performance. Accordingly, the thermoelectric devices 100 and 100' according to an embodiment may be used for various electronic devices requiring thermoelectric generation and/or thermoelectric cooling.

Hereinafter, referring to FIGS. 7 to 9, an electronic device including the thermoelectric material 10 according to an embodiment is illustrated.

Figure 7:
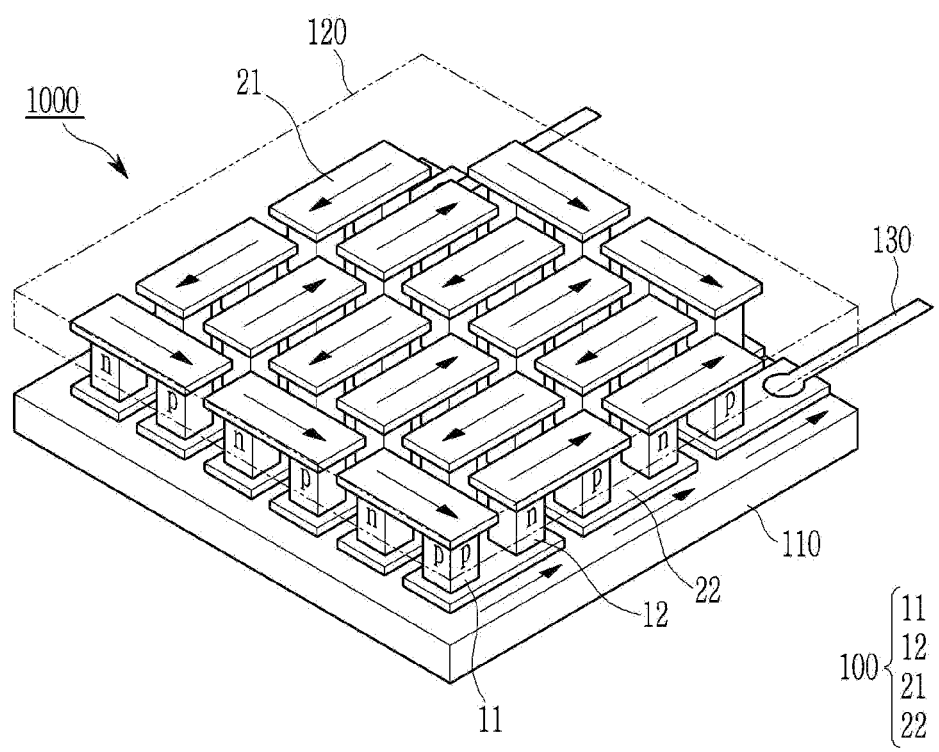
FIG. 7 is a schematic view of an exemplary electronic device including the thermoelectric device of FIG. 5.
Figure 8:
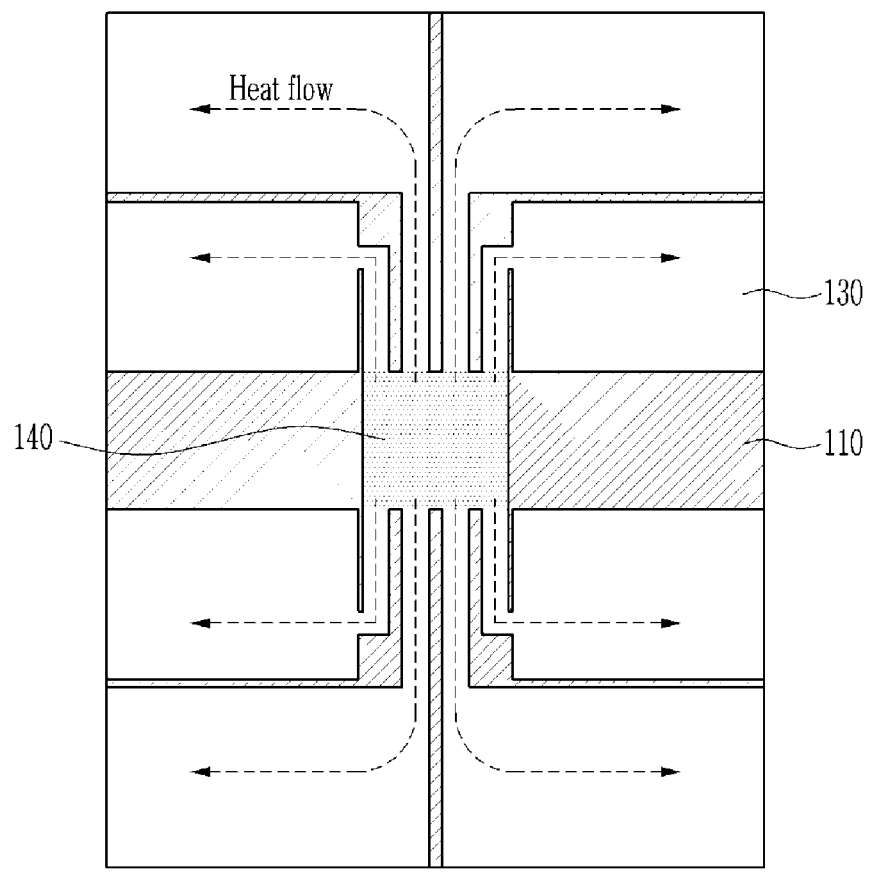
FIG. 8 is a schematic view showing the electronic device of FIG. 7 shown from the top.

FIG. 7 shows an example of an electronic device including the thermoelectric device according to FIG. 5, and FIG. 8 is a schematic view showing the electronic device of FIG. 7 as seen from the top.

Referring to FIG. 7, the aforementioned thermoelectric device 100 is disposed between the first substrate 110 and the second substrate 120 facing each other. The first electrode 21 and the second electrode 22 respectively have a predetermined pattern, and the p-type thermoelectric material 11 and the n-type thermoelectric material 12 may be disposed between the first electrode 21 and the second electrode 22. At least one of the first electrode 21 and the second electrode 22 is electrically connected to a lead electrode 130.

The first and second substrates 110 and 120 may be gallium arsenic (GaAs), sapphire, silicon, Pyrex, quartz substrate, boron nitride (BN), and the like. A material of the first and second electrodes 21 and 22 may be variously selected from copper, aluminum, nickel, gold, titanium, and the like, and a size thereof also may be variously selected. A method of patterning the first and second electrodes 21 and 22 may adopt any conventional patterning method, for example, a lift-off semiconductor method, a deposition method, a photolithography method, a plating method, a screen-printing method, an inkjet method, and the like.

On the other hand, an electron chip 140 may be disposed directly on the first substrate 110. The electron chip 140 is disposed where overlapped with the aforementioned thermoelectric device 100, as shown in FIG. 8. Herein, the thermoelectric device 100 may absorb heat generated from the electron chip 140 through the Peltier effect and release it through the lead electrode 130 out of an electronic device 1000.

In an embodiment, the electronic device 1000 may be an imbedded flexible printed circuit (FPC).

The electronic device 1000 shows excellent thermoelectric cooling efficiency due to the aforementioned thermoelectric material 10, and on the other hand, since the thermoelectric device 100 is thin-filmed, the electronic device 1000 also may be easily applied to a technical field such as Artificial Intelligence having large exothermicity due to use of a high performance electron chip, automatic driving, and the like as well as used as a thermoelectric device of an integrated electronic device such as an imbedded flexible printed circuit (FPC).

Figure 9:
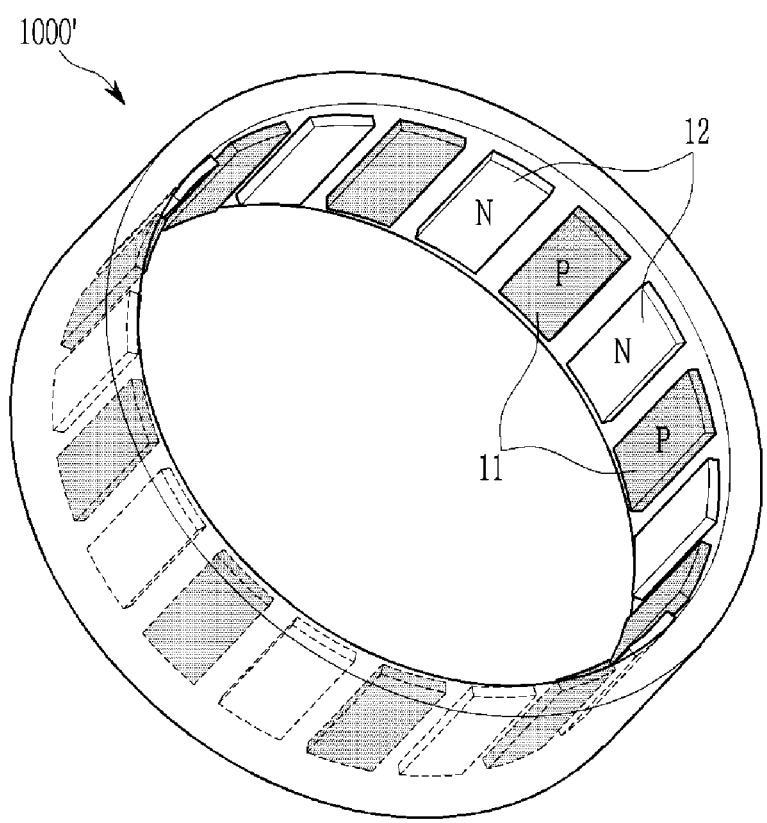
FIG. 9 is a schematic view of an exemplary electronic device including the thermoelectric device according to FIG. 6.

FIG. 9 shows an example of an electronic device including the thermoelectric device according to FIG. 6.

Referring to FIG. 9, an electronic device 1000' may be a smart ring using the Seebeck effect and alternately include a ring-shaped frame and the p-type thermoelectric material 11 and the n-type thermoelectric material 12 attached on an inner circumferential surface of the frame. The p-type thermoelectric material 11 and the n-type thermoelectric material 12 may directly contact a human body, receive heat therefrom, convert the heat into electric energy, and stores it.

Specifically, not shown in FIG. 9, the p-type thermoelectric material 11 and the n-type thermoelectric material 12 may be respectively connected to first and second electrodes 21 and 22, for example as shown in the thermoelectric device 100' of FIG. 6. In addition, the first and second electrodes 21 and 22 may be connected to an energy storage.

In this way, the electronic device 1000' according to an embodiment may energy-harvest body heat by applying the Seebeck effect to a wearable device such as a smart ring and the like and thus be easily applied to internet of Things technology and the like.

While this disclosure has been described in connection with one or more exemplary embodiments, it is to be understood that the claimed subject matter is not limited to the disclosed embodiments. On the contrary, it is intended to cover various modifications and equivalent arrangements included within the spirit and scope of the appended claims.

What is claimed is:

1. A thermoelectric material, comprising:
a thermoelectric element comprising a thermoelectric inorganic material represented by Chemical Formula 1; and
a conduction path in contact with an exterior surface of the thermoelectric inorganic material,
wherein the thermoelectric element is a nanoparticle-shaped thermoelectric element, a nanosheet-shaped thermoelectric element, or a combination thereof,
wherein the thermoelectric element comprises two or more adjacent thermoelectric elements,
wherein the conduction path is disposed between at least a portion of the two or more adjacent thermoelectric elements,
wherein the conduction path comprises a conductive material coating the exterior surface of the thermoelectric inorganic material and having an electrical conductivity of greater than or equal to about 1,000 Siemens per centimeter, and
wherein the conductive material comprises at least one of a metal oxide, a metal boride, a metal carbide, a chalcogenide, or a transition metal,

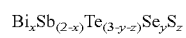  Chemical Formula 1 wherein $0<x\leq2$, $0\leq y\leq3$, $0\leq z\leq3$, and $0\leq y+z\leq3$.

2. The thermoelectric material of claim 1, wherein the conduction path is in contact with at least a portion a surface of each of the two or more adjacent thermoelectric elements.

3. The thermoelectric material of claim 1, wherein the conduction path is extended to separate the two or more adjacent thermoelectric elements by a distance.

4. The thermoelectric material of claim 3, wherein the conduction path is extended to surround each surface of the two or more adjacent thermoelectric elements.

5. The thermoelectric material of claim 1, wherein the conductive material is included in an amount of about 0.01 weight percent to about 30 weight percent based on a total weight of the thermoelectric material.

6. The thermoelectric material of claim 1, wherein the conductive material has a greater electrical conductivity than the thermoelectric inorganic material.

7. The thermoelectric material of claim 1, wherein the metal oxide comprises at least one of $RuO_2$, $MnO_2$, $ReO_2$, $VO_2$, $OsO_2$, $TaO_2$, $IrO_2$, $NbO_2$, $WO_2$, $GaO_2$, $MoO_2$, $InO_2$, $CrO_2$, and $RhO_2$.

8. The thermoelectric material of claim 1, wherein the metal boride comprises at least one of $Ta_3B_4$, $Nb_3B_4$, $TaB$, $NbB$, $V_3B_4$, and $VB$.

9. The thermoelectric material of claim 1, wherein the metal carbide comprises at least one of $Dy_2C$ and $Ho_2C$.

10. The thermoelectric material of claim 1, wherein the chalcogenide comprises at least one of $AuTe_2$, $PdTe_2$, $PtTe_2$, $YTe_3$, $CuTe_2$, $NiTe_2$, $IrTe_2$, $PrTe_3$, $NdTe_3$, $SmTe_3$, $GdTe_3$, $TbTe_3$, $DyTe_3$, $HoTe_3$, $ErTe_3$, $CeTe_3$, $Bi_2Te_3$, $TiSe_2$, $TiTe_2$, $ZrTe_2$, $HfTe_2$, $TaSe_2$, $TaTe_2$, $NbS_2$, $Hf_3Te_2$, $VSe_2$, $VTe_2$, $NbTe_2$, $LaTe_2$, $LaTe_3$, $CeTe_2$, $TiS_2$, $NbS_2$, and $TaS_2$.

11. The thermoelectric material of claim 1, wherein the transition metal comprises at least one of Ti, Zr, Hf, V, Nb, Ta, Cr, Mo, W, Mn, Fe, Co, Ni, Cu, Zn, a noble metal, and a rare earth element.

12. The thermoelectric material of claim 11, wherein the noble metal comprises at least one of Ru, Rh, Pd, Ag, Re, Os, Ir, Pt, and Au.

13. The thermoelectric material of claim 11, wherein the rare earth element comprises at least one of Sc, Y, La, Ce, Pr, Nd, Pm, Sm, Eu, Gd, Tb, Dy, Ho, Er, Tm, Yb, and Lu.

14. A thermoelectric device, comprising:
a first electrode;
a second electrode; and
the thermoelectric material of claim 1 disposed between the first electrode and the second electrode.

15. The thermoelectric device of claim 14, wherein the thermoelectric material comprises
a p-type thermoelectric material; and
an n-type thermoelectric material.

16. An electronic device, comprising the thermoelectric material of claim 1.

* * * * *